United States Patent
Divakaruni et al.

(10) Patent No.: US 6,724,053 B1
(45) Date of Patent: Apr. 20, 2004

(54) PMOSFET DEVICE WITH LOCALIZED NITROGEN SIDEWALL IMPLANTATION

(75) Inventors: Rama Divakaruni, Somers, NY (US); Ryota Katsumata, Poughkeepsie, NY (US); Giuseppe La Rosa, Fishkill, NY (US); Rajesh Rengarajan, Dresden (DE); Mary E. Weybright, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/511,395

(22) Filed: Feb. 23, 2000

(51) Int. Cl.$^7$ ............................ H01L 29/76; H01L 29/94
(52) U.S. Cl. ........................................ 257/402; 257/397
(58) Field of Search ................................ 257/344, 345, 257/392, 396, 397, 402, 408, 410, 411; 438/217, 289, 369, 514, 528

(56) References Cited

U.S. PATENT DOCUMENTS

| | | | |
|---|---|---|---|
| 4,420,872 A | 12/1983 | Solo de Zaldivar | 438/227 |
| 4,774,197 A | 9/1988 | Haddad et al. | 438/585 |
| 5,330,920 A | 7/1994 | Soleimani et al. | 438/703 |
| 5,468,657 A | 11/1995 | Hsu | 438/766 |
| 5,514,902 A * | 5/1996 | Kawasaki et al. | 257/607 |
| 5,589,407 A | 12/1996 | Meyyappan et al. | 438/766 |
| 5,674,788 A | 10/1997 | Wristers et al. | 438/301 |
| 5,851,893 A | 12/1998 | Gardner et al. | 438/305 |
| 5,861,335 A | 1/1999 | Hause et al. | 438/308 |
| 5,893,739 A | 4/1999 | Kadosh et al. | 438/286 |
| 5,908,312 A | 6/1999 | Cheung et al. | 438/287 |
| 5,909,622 A | 6/1999 | Kadosh et al. | 438/286 |
| 6,025,238 A * | 2/2000 | Gardner | 438/301 |
| 6,030,875 A * | 2/2000 | May et al. | 438/302 |
| 6,221,724 B1 * | 4/2001 | Yu et al. | 438/289 |
| 6,225,151 B1 * | 5/2001 | Gardner et al. | |

OTHER PUBLICATIONS

Kuroi et al., Novel NICE (Nitrogen Implantation into CMOS Gate Electrode and Source–Drain) Structure for High Reliability and High Performance 0.25 um Dual GAte CMOS, 1993, IEEE, pp. 325–328.*

* cited by examiner

Primary Examiner—Hung Vu
(74) Attorney, Agent, or Firm—RatnerPrestia; H. Daniel Schnurmann (57) ABSTRACT

P-type metal-oxide semiconductor field effect transistor (PMOSFET) devices have a characteristic property known as threshold voltage. This threshold voltage may consist of separate threshold voltages associated with the main portion of the gate region of the device and with the sidewall corner of the device. Under some conditions, the threshold behavior in the sidewall corner region of the device may dominate the performance of the device, not necessarily in the manner intended by the designer of the device. A method of controlling threshold voltage behavior is described. In particular, ion implantation of nitrogen in the gate sidewall region of the device can provide such control. Devices made by this method are also described.

9 Claims, 4 Drawing Sheets

PMOSFET DEVICE WITH LOCALIZED NITROGEN SIDEWALL IMPLANTATION

FIELD OF THE INVENTION

The present invention relates generally to methods for manufacturing transistors and integrated circuit devices comprising multiple transistors. In particular, the invention relates to p-type metal-oxide-semiconductor (PMOS) devices and methods for manufacturing such devices. The invention relates most particularly to field effect transistor (FET) devices, including PMOSFET devices, and the manufacture of such devices. The invention comprehends both discrete PMOS devices, or PMOS devices included in integrated circuit devices.

BACKGROUND OF THE INVENTION

There are two major types of FET devices, the metal-oxide-semiconductor field effect transistor or MOSFET (also called an insulated-gate FET, or IGFET), and the junction-gate FET, or JFET. An FET has a control gate, and source and drain regions formed in a substrate. The control gate is formed above a dielectric insulator that is deposited over the area between the source and drain regions. As voltage is applied to the control gate, mobile charged particles in the substrate form a conduction channel in the region between the source and drain regions. Once the channel forms, the transistor turns "on" and current may flow between the source and drain regions.

Transistors are used as either amplifying or switching devices in electronic circuits. In the first application, the transistor functions to amplify small ac signals. In the second application, a small current is used to switch the transistor between an "on" state and an "off state."

In recent years, the computer industry has experienced extremely rapid growth in all aspects, including number of units produced, breadth of applications, power and speed of operation, and complexity of competing machines. This growth is attributable to many factors, including remarkable increases in the number of active devices (typically transistors) included in the integrated circuit devices used in computers. By increasing the number of transistors in an integrated circuit device, the size of a computer may be reduced, or a more complex computer may be made within a particular computer case size. In addition, by increasing the number of transistors in an integrated circuit device, operational problems such as cross talk between physically adjacent conductors and signal propagation delays between different sections of the computer can be reduced. Further, integrated circuit devices are typically less expensive and more reliable than counterparts manufactured from discrete components. For these and many other reasons, the use of integrated circuit devices of increasing size and complexity has become the standard of the computer industry.

The trend toward more complex integrated circuit devices has resulted in increasing density of individual devices within the integrated circuit devices. To increase the number of individual devices within an integrated circuit, it is necessary to decrease the size of each individual device. The size of individual devices cannot be reduced arbitrarily. There are limitations to size reduction, including dimensional tolerance capabilities associated with manufacturing processes and various electrical phenomena that are associated with physical dimensions of the device. In addition, the essential need for high reliability of integrated circuit devices places limitations on shrinking the size of such devices. The steps of identifying these and other limitations and discovering techniques for ameliorating these limitations have made possible the increasing complexity of integrated circuit devices.

The prior art in the field of manufacture of PMOS devices has numerous examples of identification of problems that occur during manufacture and subsequent usage of such devices. The art also has examples of proposed solutions to the identified problems. A brief summary of some of the relevant patent art is provided below.

U.S. Pat. No. 4,420,872 issued to Soledad de Zaldivar teaches the use of nitrogen ion implantation to create a silicon nitride-containing layer as a mechanism to mask FET devices against undesired silicon oxidation during manufacture. U.S. Pat. No. 4,774,197 issued to Haddad et al. teaches the use of nitrogen ion implantation into the polycrystalline silicon gate of an FET which, during subsequent high-temperature causes a formation of silicon nitrides at the interface between the gate and the underlying gate insulation, and at the interface between the gate insulation and the underlying silicon substrate. This structure makes the gate insulation more nearly defect-free and more reliable in service.

U.S. Pat. No. 5,330,920 issued to Soleimani et al. teaches the use of nitrogen ion implantation as a mechanism to control gate oxide layer thickness. The patent teaches growing a sacrificial oxide layer on the surface of a silicon substrate, implanting nitrogen into the substrate through the sacrificial layer, removing the sacrificial layer, then growing a gate oxide layer. Where the nitrogen had been previously implanted into the substrate, the rate of gate oxide layer growth is reduced.

U.S. Pat. No. 5,468,657 issued to Hsu and U.S. Pat. No. 5,589,407 issued to Meyyappan et al. each teach the use of nitrogen ion implantation in conjunction with the growth of buried oxide layers that comprise the insulator in silicon-on-insulator (SOI) wafers used in manufacturing complementary metal-oxide-semiconductor (CMOS) devices. U.S. Pat. No. 5,908,312 issued to Cheung et al. teaches the implantation of atomic nitrogen into the silicon substrate before the growth of an oxide gate insulating layer. The patent specifically states that atomic nitrogen is the preferred species for this purpose, as opposed to molecular nitrogen.

Five recent patents, assigned to a common assignee, have taught the importance of threshold voltage in MOS transistor devices, and have described ways to control that voltage. These five patents are U.S. Pat. Nos. 5,674,788; No. 5,893,739; No. 5,909,622; No. 5,851,893; and No. 5,861,335. In the first of these patents, Wristers et al. teach that an oxynitride gate insulation layer reduces the likelihood of diffusing boron from the gate into the channel region lying below the gate. The oxynitride layer also reduces the trapping of electrons in the gate insulator. Wristers et al. also teach that the oxynitride layer is advantageously grown in situ by using a growth atmosphere that contains nitrous oxides, nitric oxides, or both.

The next two patents describe the deleterious effects of hot carriers, whether holes or electrons, that can accumulate in the gate oxide layer and raise the threshold voltage of the MOSFET device. The transistors produced according to the of these two patents feature asymmetrical construction, with a wider barrier between the gate and drain than between the gate and source. Gardner et al. teach a mechanism to control hot carrier effects by injecting barrier atoms into the silicon beneath the gate edge near the drain. Hause et al. teach implanting nitrogen into the silicon substrate on either side of the channel region, where such implantation is done concurrently or after the doping of the source and drain regions.

The existence of a threshold voltage is an inherent characteristic of MOSFET devices. In the case of a PMOSFET, a high threshold voltage signifies that the device is readily turned "on," meaning that holes flow from the source to the drain. A practical consequence of a high threshold voltage is that the PMOSFET has a greater current-driving capability, which implies a higher speed of logic level transitions. Thus, high threshold voltages in PMOSFET devices are desirable to increase the operating speed of digital circuits. Conversely, a high threshold voltage increases the susceptibility of the device to current flow between the source and drain when the gate voltage is less than the threshold voltage; that is when the device operates in a sub-threshold regime. Also, a PMOSFET having a high threshold voltage typically has less immunity to electrical noise and has higher contribution to the chip standby current resulting from an increase in channel "off current."

These effects are described in greater detail by Wristers et al. in U.S. Pat. No. 5,674,788 at Column 1, Lines 13–54, which disclosure is incorporated herein by reference. Fortunately, the threshold voltage of a PMOSFET device can be controlled by choices in the physical design of the device and by choices of manufacturing process parameters. As a general rule, PMOSFET devices are typically designed and manufactured to have a high threshold voltage, subject to constraints relating to the intended application of the devices.

SUMMARY OF THE INVENTION

Figure 1:
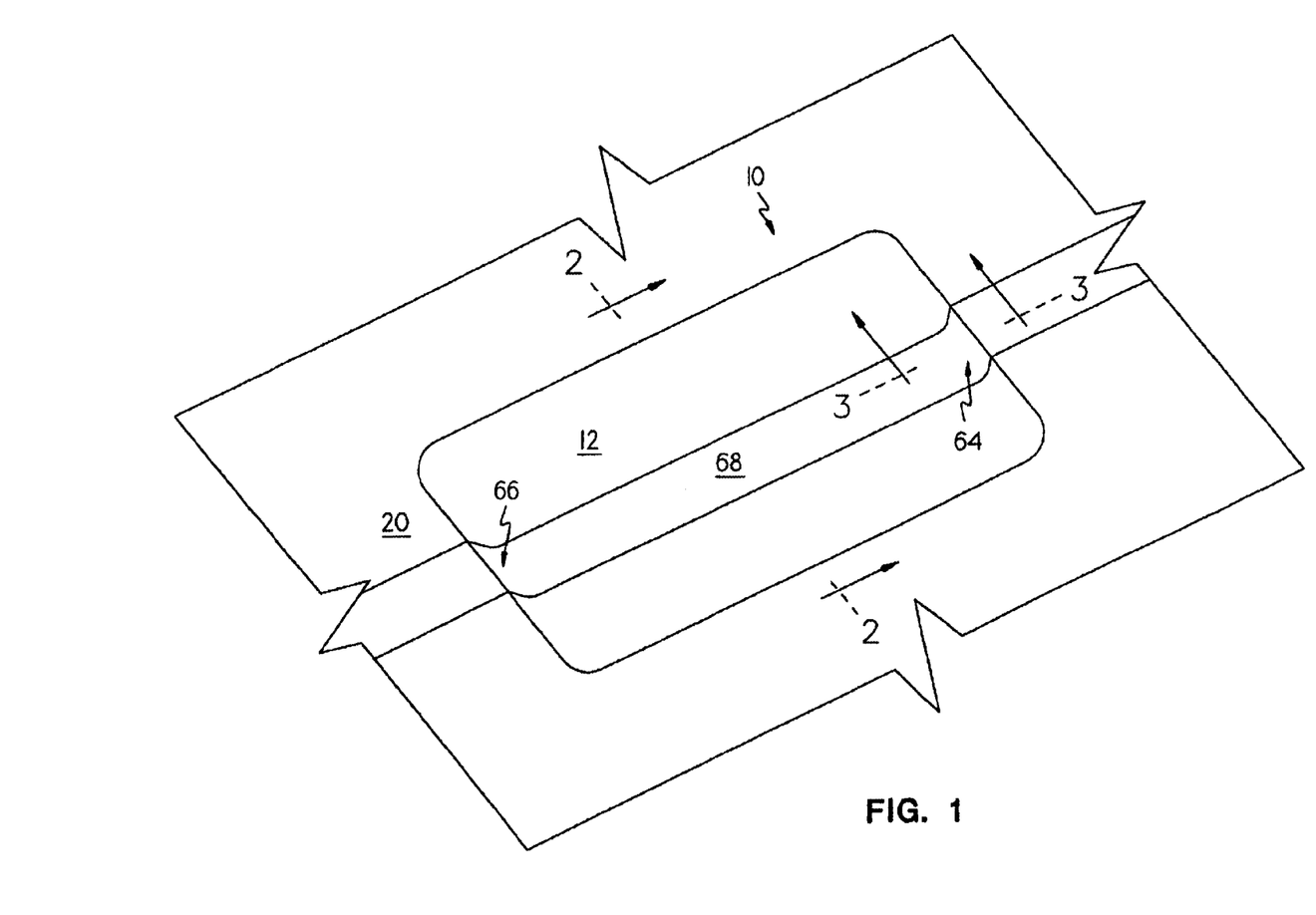
FIG. 1 illustrates, in schematic form, a perspective view of an individual PMOSFET device (an integrated circuit device might be comprised of many such individual devices)

Research leading to the present invention has indicated that a PMQSFET device may have a threshold voltage characteristic of the sidewall corner regions of the channel (identified in FIG. 1 at 64 and 66) that is different from the threshold voltage in the main section of the gate between the two sidewalls (identified in FIG. 1 at 68). The sidewall corner regions of the channel are identified at the interface between the device isolation substance and the single crystal silicon along the channel. The contribution of these regions to the sub-threshold conduction can be conveniently visualized as that of a parasitic sidewall corner PMOSFET acting in parallel with the main PMOSFET device. There may exist a situation where the threshold voltage of the main section may be low enough so that there is virtually no contribution to the channel "off current" from this region, while the threshold voltage of the sidewall corner PMOSFET device is high enough to permit significant "off current." In the extreme case, the "off current" through the sidewall corner device can be great enough for the electrical output of the device to be interpreted as "on" even though from the input signal to the gate the electrical output should be "off." The role of the sidewall corner region in controlling "off current" behavior had not been known before the present invention.

Research leading to the present invention has also shown that the channel "off current" of a PMOSFET device can be affected by the operating conditions of the device. In particular, a phenomenon called "hot carrier degradation" produces electron trapping localized in the gate-drain region of the device, this phenomenon causes an increase in the threshold voltage of the device and, therefore, and increase in channel "off current." Although this effect can occur at any location along the junction between the gate and drain, it is most acute in the gate-drain-sidewall corner region. Hot carrier degradation may result, therefore, in the activation of the parasitic sidewall corner device increasing the "off current" channel contribution. Hot carrier degradation may be either temporary or permanent. It affects operating characteristics of the device, constrains the methodologies for effective bum-in coverage, and limits aggressive use of the device.

Recognizing the considerable likelihood of PMOSFET devices having high threshold voltages in their sidewall corner regions, it is an object of the present invention to provide such devices that have reduced sensitivity to threshold voltage increases during operation and burn-in in their sidewall comer regions. It is also an object of the present invention to provide a method for manufacturing such devices. It is another object of the present invention to provide PMOSFET devices that have reduced sensitivity to parasitic sidewall comer activation and to hot carrier degradation that may take place during burn-in and use conditions.

It is a further object of the present invention to provide such technologies for both buried channel and surface channel PMOSFET devices. It is yet another object of the present invention to provide such technologies for PMOSFET devices having either thick or thin gate oxide layers, or even dual gate oxide layer thicknesses. Still other objects and advantages of the present invention will be obvious or apparent from the detailed description of the invention provided in this specification.

The method of manufacture of the present invention, as described below, accomplishes these and other objects through a combination of design concepts and embodiments of those concepts. The method is applicable to the manufacture of PMOSFET devices, both discrete devices and devices incorporated into integrated circuits. Similarly, devices manufactured in accordance with the teachings of the present invention accomplish the objects set forth above and other objects.

The essence of the present invention is implanting a low-energy dose of nitrogen at the interface along the channel region between the silicon substrate and the isolation substance before the growth of gate oxide insulation. This manufacturing process reduces the hot carrier-induced activation of parasitic sidewall corner PMOSFET devices. The accomplishment of this improvement is not restricted to a localized nitrogen implantation along the sidewall corner area, but can also be achieved by a uniform nitrogen implantation into the surface of the silicon substrate of a PMOSFET device immediately before the growth of gate oxide insulation. Other steps in the process of manufacturing the PMOSFET device are substantially similar to practices commonly used in the industry. A PMOSFET device manufactured by this method is also part of the present invention, for some of its operational characteristics are unique to devices so manufactured.

Research leading to the present invention has indicated that the method is applicable to both single and dual gate technologies. It is also applicable to PMOS devices having either thin or thick gate oxide insulators, or gate oxide insulators that have both thin and thick sections. It is therefore intended by the inventors that this discussion of their invention, and the appended claims, be interpreted as specifically including the types of devices included in this paragraph, and other related devices.

It is understood that the foregoing summary and the following detailed description of the invention are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not drawn to scale. On the contrary, dimensions of various features shown in the drawing have been arbitrarily expanded or contracted for clarity. Included in the drawing are the following figures.

DESCRIPTION OF THE INVENTION

Referring now to the figures, in which like reference numbers refer to like elements throughout, FIG. 1 depicts a representative PMOSFET device 10, which may be a discrete device or part of an integrated circuit. Cross sections through the device 10 are shown schematically in FIGS. 2 and 3. In this particular embodiment of the PMOSFET device 10, the device 10 has been constructed on the surface of a piece of single crystal silicon 12 surrounded by an isolation oxide 20. This type of design and construction is often termed shallow trench isolation (STI), or local oxidation of silicon (LOCOS).

Figure 2:
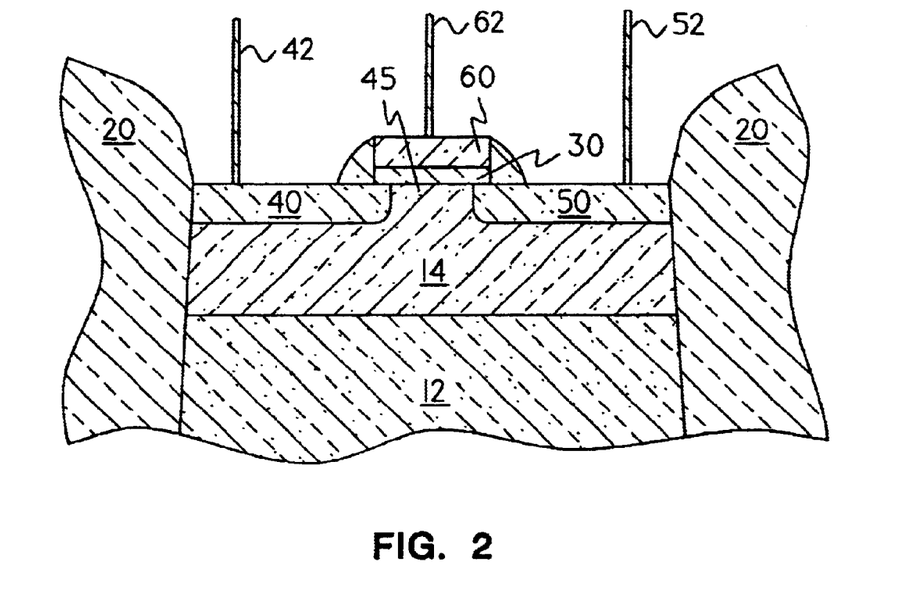
FIG. 2 illustrates, in schematic form, a cross section through the section plane, identified as 2—2 in FIG. 1, which is generally perpendicular to the surface of the device and the gate section of the device.
Figure 3:
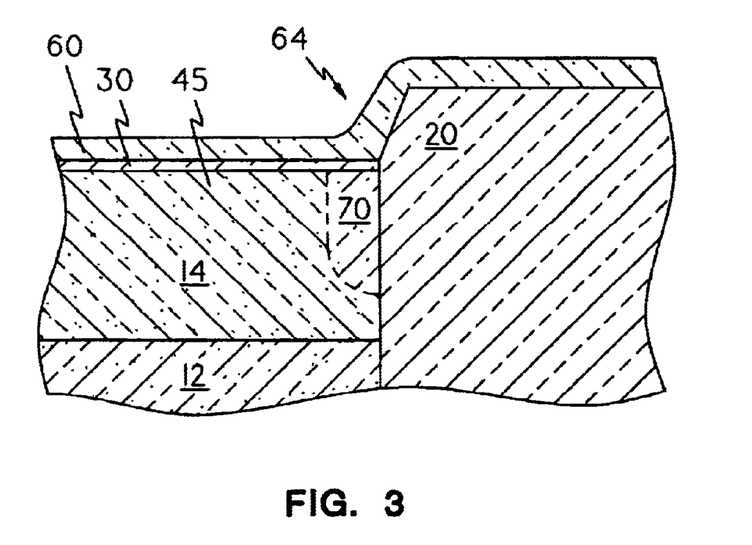
FIG. 3 illustrates, in schematic form, a partial cross section through the section plane, identified as 3—3 in FIG. 1, which is generally perpendicular to the surface of the device and cuts through the center portion of the gate region of the device (the region depicted in this figure encompasses the sidewall corner region of a PMOSFET device)

During manufacturing of the device 10, the surface of the single crystal silicon 12 is doped with an element such as phosphorus, arsenic, or antimony to create a zone of n-type silicon 14 (see FIGS. 2 and 3). An electrically nonconductive substance, typically silicon dioxide, which represents a preferred embodiment of the present invention, is used as the isolation oxide 20 to provide electrical isolation from other active devices fabricated on the same silicon substrate. A thin insulation layer 30, typically silicon dioxide or silicon nitride, is applied to the top of the single crystal silicon 12; portions of this oxide insulation layer 30 are subsequently stripped away to expose source and drain regions of the device, 40 and 50, respectively. The remaining portion of the insulating layer 30 may be termed the gate oxide layer. A layer of polycrystalline silicon is applied above the gate oxide layer forms the gate 60. Electrical connections between other components of an integrated device and the source 40, drain 50, and gate 60 are shown schematically at 42, 52, and 62, respectively. In practice, these connections may be layers of metallic materials deposited onto selected portions of an integrated circuit to interconnect the various elements of the circuit, as required by the design of the circuit.

The source 40 and drain 50 are doped, typically by the diffusion of boron, to become p-type semiconductors. A region of the single crystal silicon lying between the source 40 and drain 50 and beneath the gate insulation layer 30 is carefully maintained as n-type material and forms the channel 45. Electric current can flow through a PMOSFET between the source and drain when a sufficiently small negative voltage is applied to the gate. This is the basic function of the FET.

The particular problem addressed by the present invention exists at the sidewall corner interfaces 64 and 66 shown in FIG. 1. (The sidewall corner interface 64 is shown in cross section in FIG. 3.) The sidewall corner interfaces 64 and 66 are located at both ends of the gate 60 and are distinguishable from the main section 68 of the gate 60 between the two sidewalls. Each sidewall has a generally vertical orientation, and the combination of that orientation, plus structural characteristics of the materials in the sidewall corner areas, lead to electrical functionality that differs from performance in central portions of the device 10.

A PMOSFET device has a characteristic threshold voltage; when such a voltage is applied to the gate, the device is shifted into an activated or "on" state. A less negative threshold voltage implies that the device is readily turned on. If operating conditions of a device admit to its being activated inadvertently, the device cannot function according to its design intent. In particular, for a PMOSFET device that can be activated (i.e., allowing holes to flow from source to drain) despite a normally high voltage applied to its gate, a significant parasitic current or "off current" can flow through the device. The "off current" represents a characteristic of the device itself, rather than the operating parameters imposed on the device. Thus, if a device with a high "off current" is part of a computer memory chip, that device will always provide an output indicative of a high gate voltage, independently of whatever information was stored there by the computer operator or the computer operating system. Obviously, this situation is unacceptable.

The solution to the PMOSFET sidewall corner interface hot carrier-induced instability is attained using a localized nitrogen implantation into the interface area between the isolation oxide 20 and the single crystal silicon 12 along the active channel 45 of the device 10, which results in an elevated nitrogen content within the portion 70 of the channel 45 nearest the sidewall (see FIG. 3). This implant must be done at least locally along the interface. A block mask is required to protect the channel area from the nitrogen implant while implanting in the channel region along the interface. The block mask assures that the threshold voltage of the main device is not perturbed by the nitrogen implant.

In technologies using uniform nitrogen implantation to grow a thin gate, the same nitrogen implantation used to grow the oxide can be used to implant the sidewall corner interface reducing the parasitic sidewall corner PMOSFET instability. If the dose and energy selected for the uniform nitrogen implant to grow the gate oxide are not adequate to reduce the sensitivity to the parasitic PMOSFET sidewall corner activation, then an extra localized nitrogen implant along the sidewall corner and silicon interface is needed. This procedure represents a second sub-step in the process.

Although manufacturing processes commonly used in the industry are more complicated than the following outline, the key manufacturing steps in the manufacturing process of the present invention include the following:

Masking and etching a silicon wafer to create a series of openings upon the wafer;

Filling the openings with insulating material to provide electrical isolation between adjacent exposed regions of the silicon wafer;

Growing a sacrificial oxide layer upon the exposed regions of the silicon wafer;

Doping the exposed regions of the single crystal silicon wafer, to produce n-type material in those regions, using dopants such as phosphorus, arsenic, or antimony;

Implanting nitrogen into an interface area between the insulating material and the single crystal silicon along an active channel of the device;

Stripping away at least a portion of the sacrificial oxide layer;

Growing a gate oxide insulator on the silicon wafer;

Depositing a polycrystalline silicon layer over the gate oxide insulator;

Patterning the polycrystalline silicon to form a gate; and

Doping regions of silicon adjacent to the gate oxide insulator to produce p-type material (boron is the dopant typically used to obtain p-type material).

As indicated above, additional manufacturing steps are typically used to produce PMOSFET devices. Note that the same process may be used to produce either discrete devices or integrated circuit devices. In the context of the present invention, the term "device" includes both discrete devices consisting of a single transistor, or integrated circuit devices comprising many transistors. The present invention is particularly applicable to integrated circuit devices, and the manufacture of such devices, and that application constitutes a preferred embodiment of the invention. In the most preferred form of the present invention, the nitrogen implanted in the PMOSFET device 10 is preferably supplied to the implantation apparatus in the molecular form ($N_2$).

EXAMPLE

The following example is included to more clearly demonstrate the overall nature of the invention. This example is exemplary, not restrictive, of the invention.

To test the theory of the present invention, several PMOSFET devices were manufactured and tested. The devices were buried channel dynamic random access memory (DRAM) devices. DRAM cells can retain information only temporarily, on the order of milliseconds, even with power continuously applied. Therefore, the cells must be read and refreshed at periodic intervals. Although the storage time may appear to be short, it is actually long enough to allow many memory operations to occur between refresh cycles. The advantages of cost per bit, device density, and flexibility of use (i.e., both read and write operations are possible) have made DRAM cells the most widely used form of semiconductor memory to date. The earliest DRAM cells were three-transistor cells. Today, DRAM cells consisting of only one transistor and one capacitor have been implemented.

Figure 4:
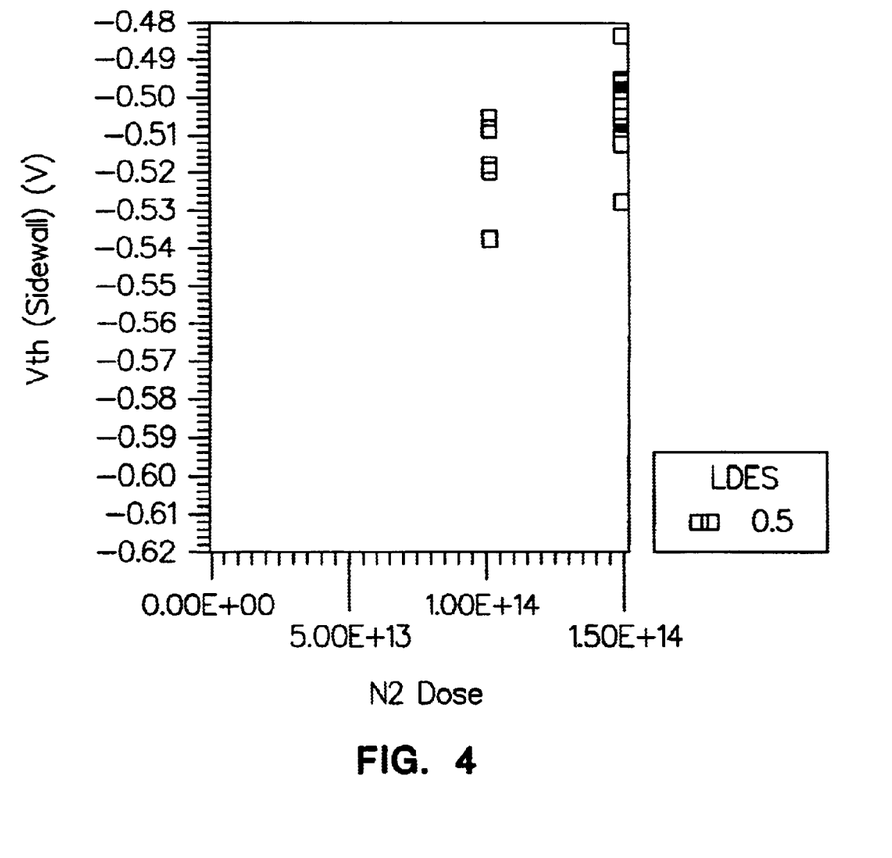
FIG. 4 illustrates the reduction in sidewall threshold voltage ($V_{th}$) of buried channel PMOSFET devices achieved by implanting molecular nitrogen in the silicon substrate before gate oxide growth.

A control group of four devices was made using customary production line technology. Two groups, containing five and nine devices, were subjected to nitrogen molecule implantation doses of $1.0 \times 10^{14}$ and $1.5 \times 10^{14}$ ions per square centimeter, respectively. All implantation was done at an energy level of 12 keV. The sidewall threshold voltage was measured for each device. These data are presented in FIG. 4. Note that there was a clear decrease in sidewall threshold voltage, $V_{th}$ (Sidewall), as the dosage of nitrogen ion implantation was increased.

Figure 5:
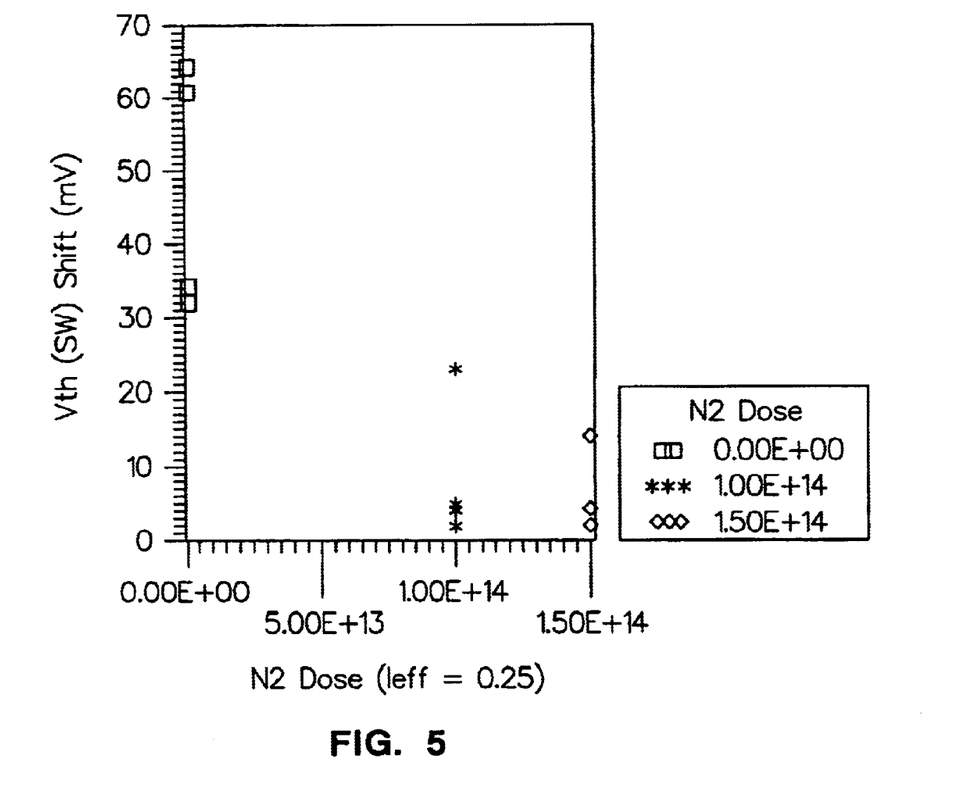
FIG. 5 illustrates the reduction in sidewall threshold voltage ($V_{th}$) shift that can be achieved by implanting nitrogen in the silicon substrate before growth of the gate oxide insulator.

In addition, the threshold voltage sidewall shift, VTH (SW) SHIFT, was measured. These data are presented in FIG. 5. There was a clear reduction in the threshold voltage sidewall shift as a function of increasing nitrogen implantation. These data were interpreted as confirming the correctness of the theory, and establishing a range of workable ion implantation doses.

On the basis of the results of the experiments conducted during development of the present invention, it was concluded that an ion implantation dose of nitrogen molecules of 1.0 to $1.5 \times 10^{14}$ ions per square centimeter, at an energy level between about 10 and about 1.5 keV, represents a preferred embodiment of the invention. The experiments provided no indication, however, that these values represent maximum and minimum allowable values. Satisfactory results may presumably be achieved outside the range of values determined in this Example, and are considered within the scope of the present invention.

Although illustrated and described above with reference to certain specific embodiments and an example, the present invention is nevertheless not intended to be limited to the details shown. Rather, various modifications may be made in the details within the scope and range of equivalents of the claims and without departing from the spirit of the invention.

What is claimed:

1. A p-type metal oxide semiconductor field effect transistor (PMOSFET) device fabricated on a silicon substrate, comprising:

a source, a gate, a drain, and a N-well positioned underneath the gate and separating said source from said drain, said source, gate, drain, and N-well forming an active area;

a channel underneath said gate, coupling said source to said drain to allow channel conduction from said source to said drain;

an isolation layer surrounding said active area; and a localized nitrogen implanted layer positioned only along the edges separating said isolation layer from said active area and underneath said channel, at both interface sides of said active area that are parallel to said channel, said localized nitrogen implanted layer extending from an exposed area of the drain to at least underneath said gate, said localized nitrogen implanted layer positioned at the edges underneath only a portion of front and back surfaces of said gate, leaving the region defined by said source and said drain substantially free of said localized nitrogen implanted layer.

2. The PMOSFET device recited in claim 1, wherein said localized nitrogen implanted layer defines a sidewall region along the sides of the interface separating the isolation layer from the active area, said localized nitrogen implanted layer reducing the electron trapping along the sidewall region with respect to the active area outside the sidewall region.

3. The PMOSFET device as recited in claim 2, wherein the sidewall region protects the active area from damage along the sides of said interface separating the isolation layer from the active area.

4. The PMOSFET device as recited in claim 2, wherein said electron trapping is caused by hot carrier degradation.

5. The PMOSFET device as recited in claim 2, wherein said channel positioned underneath the gate is buried within said N well region, said localized nitrogen implanted layer extending across said channel to protect said sidewall region from damage.

6. The PMOSFET device as recited in claim 2, having a first threshold voltage associated with said sidewall region and a second threshold voltage associated with said channel, wherein said first threshold voltage does not increase in value due to electron trapping, said localized nitrogen implanted layer making the device immune from damage caused by said electron trapping.

7. The PMOSFET device as recited in claim 6, is a device selected from the group that consists of a buried channel device and a surface channel device.

8. A p-type metal oxide semiconductor field effect transistor (PMOSFET) device fabricated on a silicon substrate, comprising:

a source, a gate, a drain, and an N-well positioned under the gate and separating the source from the drain and forming an active area;

sidewalls of insulating material surrounding said active area and forming an isolation layer;

a channel under said gate, coupling said source to said drain to allow channel conduction from the source to the drain; and a localized nitrogen implanted layer positioned only along the edges separating the isolation layer from the active area and underneath said channel at both interface sides of said active area that are parallel to the channel, said localized nitrogen layer extending from an exposed area of said drain to at least an exposed area of said source, said localized nitrogen implanted layer positioned at the edges underneath only a portion of front and back surfaces of said gate, leaving the region defined by said source and said drain substantially free of said localized nitrogen implanted layer, said PMOSFET being substantially immune to sidewall corner interface hot carrier induced instability.

9. The PMOSFET device as recited in claim 8, wherein said localized nitrogen implanted layer extends from said exposed area of said drain to at least said exposed area of said source, including underneath said gate.

* * * * *

UNITED STATES PATENT AND TRADEMARK OFFICE
CERTIFICATE OF CORRECTION

PATENT NO.    : 6,724,053 B2
DATED         : February 25, 2003
INVENTOR(S)   : Hahn et al.

It is certified that error appears in the above-identified patent and that said Letters Patent is hereby corrected as shown below:

<u>Title page,</u>
Item [73], Assignee, please delete "Rite-Holding Holding Corporation" and insert -- Rite-Hite Holding Corporation --.

Signed and Sealed this

Twentieth Day of July, 2004

JON W. DUDAS
*Acting Director of the United States Patent and Trademark Office*